(12) United States Patent
Brandl et al.

(10) Patent No.: US 10,370,244 B2
(45) Date of Patent: Aug. 6, 2019

(54) DEPOSITION OF PROTECTIVE MATERIAL AT WAFER LEVEL IN FRONT END FOR EARLY STAGE PARTICLE AND MOISTURE PROTECTION

(71) Applicant: Infineon Technologies AG, Neubiberg (DE)

(72) Inventors: Florian Brandl, Wolnzach (DE); Manfred Fries, Hunderdorf (DE); Franz-Peter Kalz, Regensburg (DE)

(73) Assignee: Infineon Technologies AG (DE)

( * ) Notice: Subject to any disclaimer, the term of this patent is extended or adjusted under 35 U.S.C. 154(b) by 9 days.

(21) Appl. No.: 15/827,057

(22) Filed: Nov. 30, 2017

(65) Prior Publication Data
US 2019/0161345 A1    May 30, 2019

(51) Int. Cl.
| | |
|---|---|
| *B81C 1/00* | (2006.01) |
| *B81B 7/00* | (2006.01) |
| *H01L 23/04* | (2006.01) |
| *H01L 23/10* | (2006.01) |
| *H01L 21/50* | (2006.01) |
| *B29C 35/02* | (2006.01) |

(52) U.S. Cl.
CPC ........ *B81C 1/00285* (2013.01); *B81B 7/0029* (2013.01); *B81B 7/0038* (2013.01); *B81B 7/0045* (2013.01); *B81B 7/0051* (2013.01); *B81C 1/0019* (2013.01); *B81C 1/0038* (2013.01); *B81C 1/00063* (2013.01); *B81C 1/00301* (2013.01); *B81C 1/00904* (2013.01); *H01L 21/50* (2013.01); *H01L 23/04* (2013.01); *H01L 23/10* (2013.01); *B29C 35/02* (2013.01); *H01L 2924/16235* (2013.01)

(58) Field of Classification Search
CPC ............................ B81B 7/0045; B81B 7/0051
USPC ......................................................... 257/415
See application file for complete search history.

(56) References Cited

U.S. PATENT DOCUMENTS

| | | | |
|---|---|---|---|
| 6,379,988 B1 | 4/2002 | Peterson et al. | |
| 9,846,096 B2 * | 12/2017 | Chen | ..................... G01L 9/0042 |
| 2006/0001114 A1 | 1/2006 | Chen et al. | |
| 2007/0090473 A1 * | 4/2007 | Engling | ................ B81B 7/0058 257/414 |

(Continued)

FOREIGN PATENT DOCUMENTS

EP    1 296 388 A2    3/2003

OTHER PUBLICATIONS

Chen, Lung-Tai, Jin-Sheng Chang, Chung-Yi Hsu, and Wood-Hi Cheng "Fabrication and Performance of MEMS-Pressure Sensor Packages Using Patterned Ultra-Thick Photoresists", Sensors 2009, 9, 6200-6218; doi:10.3390/s90806200.

*Primary Examiner* — David Vu
(74) *Attorney, Agent, or Firm* — Design IP

(57) ABSTRACT

A semiconductor device and a method of manufacturing the same are provided such that a microelectromechanical systems (MEMS) element is protected at an early manufacturing stage. A method for protecting a MEMS element includes: providing at least one MEMS element, having a sensitive area, on a substrate; and depositing, prior to a package assembly process, a protective material over the sensitive area of the at least one MEMS element such that the sensitive area of at least one MEMS element is sealed from an external environment, where the protective material permits a sensor functionality of the at least one MEMS element.

19 Claims, 4 Drawing Sheets

(56) References Cited

U.S. PATENT DOCUMENTS

| | | | |
|---|---|---|---|
| 2013/0221455 A1* | 8/2013 | Manack | B81C 1/00246 257/416 |
| 2013/0270660 A1* | 10/2013 | Bryzek | H01L 29/84 257/418 |
| 2016/0090297 A1* | 3/2016 | Zhang | B81B 7/0048 257/417 |
| 2016/0146692 A1* | 5/2016 | Fontana | G01L 19/148 257/420 |
| 2017/0197823 A1* | 7/2017 | Wachtler | H01L 23/3135 |

* cited by examiner

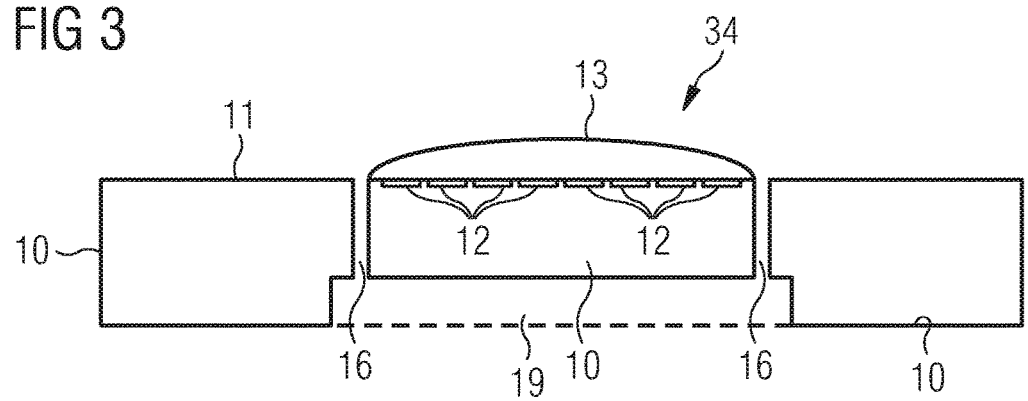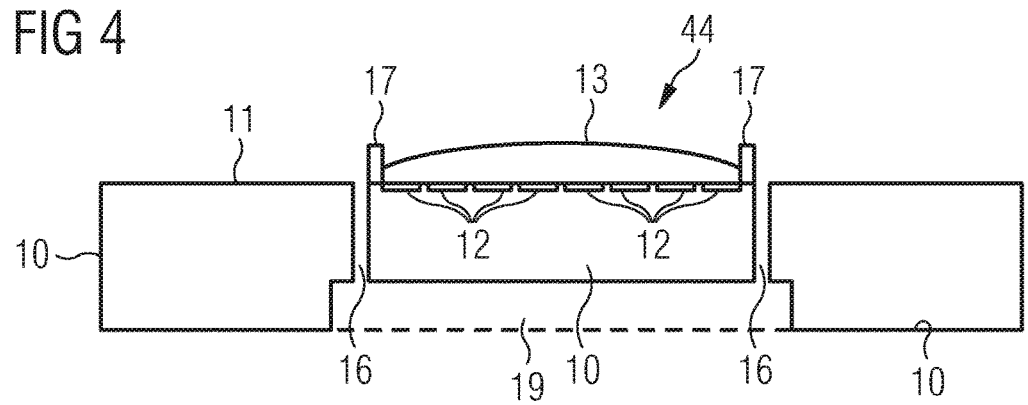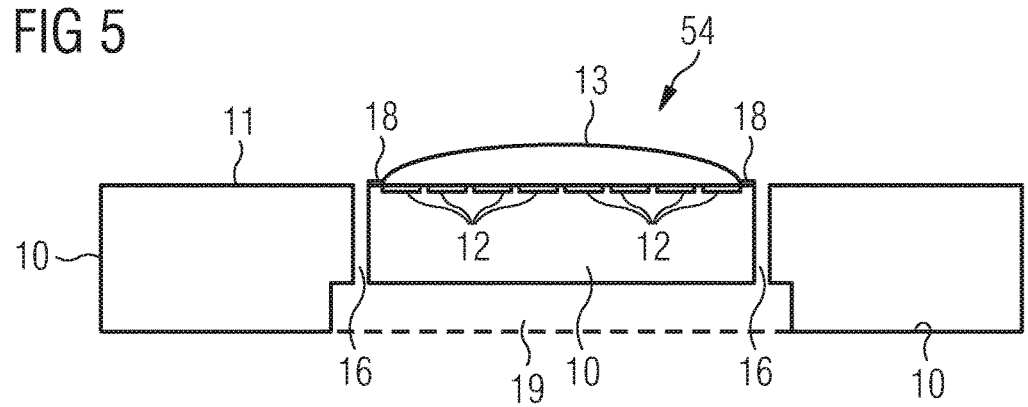

DEPOSITION OF PROTECTIVE MATERIAL AT WAFER LEVEL IN FRONT END FOR EARLY STAGE PARTICLE AND MOISTURE PROTECTION

FIELD

The present disclosure relates generally semiconductor devices and a method of manufacturing the same, and, more particularly, to deposition of protective material at a wafer level in a front end process for early stage protection.

BACKGROUND

During fabrication of a semiconductor device, a wafer serves as a substrate for microelectronic devices built in and over the wafer and may undergo many microfabrication process steps such as doping or ion implantation, etching, deposition of various materials, and photolithographic patterning. Finally, the individual microcircuits are separated (dicing) and packaged.

Microelectromechanical systems (MEMS) is a technology of microscopic devices, particularly those with moving parts. MEMS became practical once they could be fabricated using modified semiconductor device fabrication technologies, normally used to make electronics. Thus, a MEMS may be built into a substrate as a component of an integrated circuit, that is diced into a semiconductor chip that is subsequently mounted in a package.

A protective material may be dispensed extensively all over the semiconductor chip and package at the end of the assembly process (i.e., filling of a cavity within the package). In some cases, particle protection is realized via a lid construction that is disposed over an opening of the package.

When a protective material is dispensed at the end of the assembly process, particles from a preassembly processes (i.e., prior to mounting the chip to the package) or a foregoing assembly process can reach the surface of a MEMS element or device. While miniaturization of MEMS elements evolves, smaller and smaller particles are playing a role, and are at the same time becoming more difficult to detect and screen. Furthermore, using a lid for particle protection does not provide absolute protection from humidity.

SUMMARY

A semiconductor device and a method of manufacturing the same are provided such that a microelectromechanical systems (MEMS) element is protected at an early manufacturing stage.

Embodiments provide a method for protecting a MEMS element, including providing at least one MEMS element, having a sensitive area, on a substrate; and depositing, prior to a package assembly process, a protective material over the sensitive area of the at least one MEMS element such that the sensitive area of at least one MEMS element is sealed from an external environment, where the protective material permits a sensor functionality of the at least one MEMS element.

Embodiments further provide a semiconductor device including a semiconductor chip. The semiconductor chip includes a substrate; at least one MEMS element, having a sensitive area, disposed on the substrate; a protective material disposed over the sensitive area of the at least one MEMS element such that the sensitive area of at least one MEMS element is sealed from an external environment, where the protective material is configured to permit a sensor functionality of the at least one MEMS element; and a package to which the semiconductor chip is mounted.

BRIEF DESCRIPTION OF THE DRAWINGS

Embodiments are described herein making reference to the appended drawings.

FIG. 3 shows a cross-sectional diagram of a chip according to one or more embodiments;

FIG. 4 shows a cross-sectional diagram of another chip according to one or more embodiments;

FIG. 5 shows a cross-sectional diagram of still another chip according to one or more embodiments;

DETAILED DESCRIPTION

Figure 1:
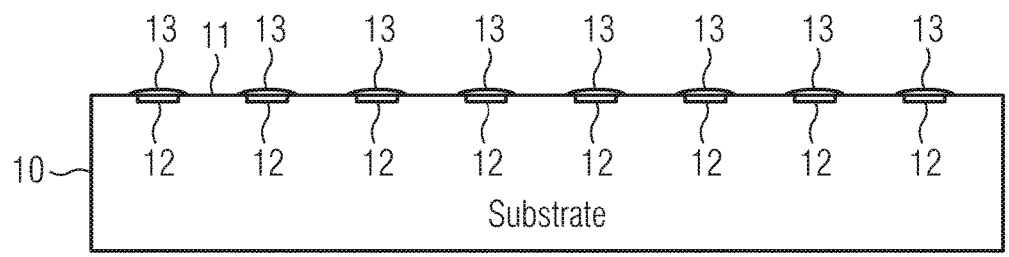
FIG. 1 shows a cross-sectional diagram of a wafer at a front-end stage of a chip fabrication process according to one or more embodiments.

In the following, various embodiments will be described in detail referring to the attached drawings, where like reference numerals refer to like elements throughout. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

Embodiments relate to microelectromechanical systems (MEMS), and particularly to a MEMS pressure sensor integrated on a semiconductor chip and subsequently mounted to a package. The MEMS may be referred to as a MEMS element or MEMS device. The package is adapted to enable the MEMS pressure sensor to detect and/or measure a force imposed thereon. For example, the MEMS pressure sensor may operate as a transducer that generates an electrical signal as a function of the pressure imposed, and the package may have an opening formed in proximity to the MEMS pressure sensor that allows a medium to interact with the MEMS pressure sensor. The medium may be any pressure measurable or pressure inducing entity.

In general, a sensor, as used herein, may refer to a component which converts a physical quantity to be measured to an electric signal, for example a current signal or a voltage signal. The physical quantity may, for example, be pressure as an expression of force imposed on a sensitive area or region of the sensor. Debris, such as foreign particles, may negatively impact the performance of any sensor. Thus, it is desirable to prevent debris from reaching the surface of the sensor, and, specifically, from reaching the sensitive area or region of the sensor.

A manufacturing process for semiconductor chip fabrication may include two sequential sub-processes commonly referred to as front-end and back-end production. The back-end production may further include two sequential sub-processes commonly referred to as pre-assembly and assembly.

Front-end production refers primarily to wafer fabrication. A wafer, as used herein, may also be referred to as a substrate. The front-end production may start with a clean disc-shaped silicon wafer that will ultimately become many silicon chips. First, a photomask that defines the circuit patterns for circuit elements (e.g., transistors) and interconnect layers may be created. This mask may then be laid on the clean silicon wafer and is used to map the circuit design. Transistors and other circuit elements may then be formed on the wafer through photolithography. Photolithography involves a series of steps in which a photosensitive material is deposited on the wafer and exposed to light through a patterned mask; unwanted exposed material is then etched away, leaving only the desired circuit pattern on the wafer. By stacking the various patterns, individual elements of the semiconductor chip may be defined. A MEMS device or MEMS element may also be incorporated onto and/or into the surface of the wafer and connected to one or more circuit elements. During the final phase of the front-end production process, each individual chip on the wafer is electrically tested to identify properly functioning chips for assembly.

Back-end production refers to the assembly and test of individual semiconductor devices or chips. The assembly process is intended to protect the chip, facilitate its integration into electronic systems, limit electrical interference and enable the dissipation of heat from the device. Once the front-end production process is complete, the wafer is sawed or diced into individual semiconductor chips. This dicing of the wafer into individual semiconductor chips is referred to as pre-assembly.

In an assembly phase of the back-end production, the semiconductor chips are incorporated into a package. For example, these semiconductor chips may be individually attached by means of an alloy or an adhesive to a lead frame, a metallic device used to connect the semiconductor to a circuit board. Leads on the lead frame may then be connected by aluminum or gold wires to the input/output terminals on the semiconductor chip through the use of automated machines known as wire bonders. Each semiconductor device may then be at least partially encapsulated in a plastic molding compound or ceramic case, forming the package.

Thus, a MEMS element may be built into a substrate as a component of an integrated circuit, the substrate then being diced into semiconductor chips that are each subsequently mounted in a package.

It will be appreciated that while the pre-assembly (i.e., dicing) process may be described as part of the back-end production, the chips may be partially singulated during final phase of the front-end production. Thus, in some instances, pre-assembly may begin or may be performed during the front-end production.

According to one or more embodiments, a protective material (e.g., a silicone gel) is deposited on a MEMS element at the wafer level (i.e., during the front-end production process), or during or subsequent to the pre-assembly process, but prior to assembly (i.e., packaging). The protective material may be deposited on an exposed surface of the MEMS element such that an entire exposed surface of the MEMS element is covered by the protective material.

The exposed surface of the MEMS element may include or may be referred to as a sensitive area that enables the MEMS element to measure a physical quantity. For example, the MEMS element may be a MEMS pressure sensor that is configured to detect or measure a change in pressure in response to a change of force imposed on the exposed surface. The protective material is configured such that, when the MEMS element is covered by the protective material, a sensor functionality of the MEMS element remains intact. For example, the protective material may be a silicone gel that has an elastic modulus and/or a Poisson's ratio that permits a force exerted thereon to be transferred to the MEMS pressure sensor. Thus, the protective material is flexible enough that when the protective material is depressed, the sensitive area of the MEMS pressure sensor is also depressed proportionally.

More particularly, the protective material permits full sensor functionality of the MEMS element, including mechanical functionality and electrical functionality, while sealing an entire surface of the MEMS element. Even more particularly, the protective material is configured such that no functionality of the MEMS element is impeded by the protective material.

By ensuring that the functionality of the MEMS element remains intact, the protective material may be deposited onto the MEMS element as a permanent material at an early stage of the chip fabrication process. Thus, the MEMS element may already be configured in an operable state (e.g., a final operable state) at the time the protective material is deposited onto the MEMS element, and the protective material may remain completely intact after deposition, including throughout the assembly process, such that it remains a feature in the final product.

As a result of the early deposition of the protective material, the MEMS element is provided early particle and humidity protection from foreign matter that may have been introduced during (pre-)assembly processes that could influence the sensor performance.

While some embodiments provided herein may refer to the protective material as being a temperature hardening gel (e.g., silicone gel), others may use a ultraviolet (UV) hardening gel. However, the protective material is not limited thereto, and may be any material that provides protection from foreign matter while permitting sensor functionality of the MEMS element, and more particularly permits sensor functionality of the MEMS element at the time of deposition of the protective material. Thus, the protective material may be any temperature or UV hardening gel.

FIG. 1 shows a cross-sectional diagram of a wafer at a front-end stage of a chip fabrication process according to one or more embodiments. The wafer is a substrate 10 that includes a main surface 11 and MEMS elements 12 provided thereon. Each of the MEMS elements 12 may be embedded into the substrate 10 on the main surface 11 of the substrate 10 with a surface (e.g., upper surface as shown) exposed. Further, each of the MEMS elements 12 may correspond to a single chip formed at a subsequent step of the chip fabrication process. However, it will be appreciated that a chip may include multiple MEMS elements integrated thereon.

The exposed surface of the MEMS element 12 may be or may include a sensitive area configured to detect a physical quantity, such as pressure, such that the physical quantity can be measured. After the MEMS element 12 is provided on the substrate 10, a protective material 13 may be deposited locally, for example, in the form of small droplets, on each MEMS element 12, and then cured (e.g., thermal curing at about 150° C.). The protective material 13 is deposited locally such that the exposed surface of each MEMS element 12 is covered by the protective material 13. More particularly, the protective material 13 is deposited locally such that the sensitive area of each MEMS element 12 is covered by the protective material 13. Thus, it can be said that the protective material 13 is deposited as a locally defined droplet confined to a local region of the substrate 10 that surrounds each MEMS element 12.

The protective material 13 is deposited locally in manner such that bond pads of a "to be" chip corresponding to the MEMS element are not coated by the protective material 13. One possible method for depositing the locally positioned droplets of protective material 13 is by inkjet printing or micro dispensing. However, the embodiments are not limited to a particular method for depositing the protective material 13.

In view of the above, each MEMS element 12 is sealed at its upper surface from an external environment that may protect the MEMS element 12 from particles and humidity that may contaminate the MEMS element 12. Furthermore, the protective material 13 is composed of a material (e.g., temperature hardening gel or UV hardening gel) that permits a sensor functionality of the each MEMS element 12. More particularly, protective material 13 permits full sensor functionality of the MEMS element, including mechanical functionality and electrical functionality, while sealing an entire (upper) surface of each MEMS element 12.

Figure 2:
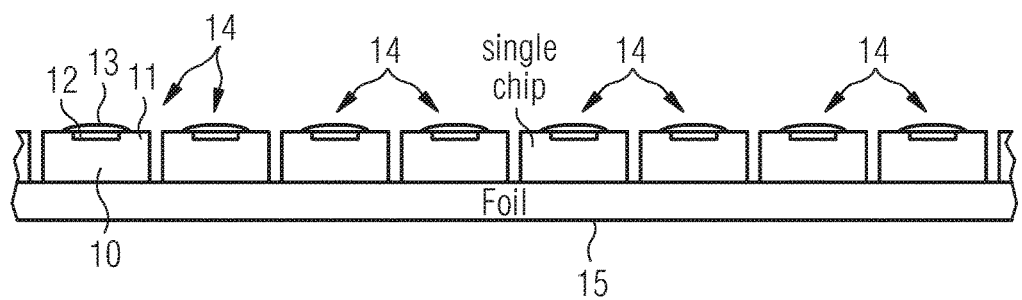
FIG. 2 shows a cross-sectional diagram of another wafer during a preassembly stage of a chip fabrication process according to one or more embodiments.

FIG. 2 shows a cross-sectional diagram of another wafer during another stage of a chip fabrication process according to one or more embodiments. In particular, the protective material 13 (i.e., the locally dispensed droplets) is dispensed after a preassembly process. Specifically, the protective material 13 is dispensed after the individual chips 14 are formed, but prior to an assembly process (i.e., a package assembly process).

Here, the wafer substrate 10 may be attached to a foil layer 15 and the chips 14 are singulated by a sawing process or dicing process. Subsequent to forming the individual chips 14, the protective material 13 may be dispensed in a controlled manner over each of the MEMS elements 12. A UV hardening gel may be used as the protective material 13 since the foil layer 15 may not withstand heat used in the curing process. Thus, protective materials that are cured by thermal curing may need to be avoided according to the use of the foil layer 15.

It will also be appreciated that a single chip 14 may include multiple MEMS elements 12, as will be discussed in conjunction with other examples below.

FIG. 3 shows a cross-sectional diagram of a chip 34 according to one or more embodiments. The chip 34 includes a substrate 10 having a main surface 11 and multiple MEMS elements 12 provided thereon. It will be appreciated that, while multiple MEMS elements 12 are shown, the chip 34 may be include a single MEMS element 12.

The chip 34 further includes a stress-decoupling feature made of one or more deep trenches 16 (i.e., one or more stress-decoupling trenches) and a backside cavity 19 that is integrally formed with the one or more trenches 16. The trenches 16 and backside cavity 19 may be formed to establish a spring structure surrounding the MEMS element 12 which decouples the MEMS elements 12 from stress coming from the package or the rest of the chip. Thus, a stress-decoupling feature prevents a shift in a sensor signal produced by one or more of the MEMS elements 12 due to external mechanical influences.

Each trench 16 is laterally spaced from each outer MEMS element 12 and extends into the substrate 10. The protective material 13 is dispensed in a controlled manner such that the exposed surfaces of the MEMS elements 12 are covered by the protective material 13. The protective material 13 may be dispensed as a single droplet or as multiple droplets that cover a local region, including the MEMS elements 12.

Furthermore, the protective material 13 may be configured to stop at an inside edge of each trench 16 such that the protective material 13 does not enter the trench 16. In particular, the protective material 13 is confined to an area within a region defined by the one or more trenches 16. The protective material 13 may stop at 90° to the edge of each trench 16. For example, a viscosity of the protective material 13 in combination with controlled placement of the protective material 13 may allow the protective material 13 to stop flowing prior to entering a trench 16.

It will also be appreciated that, similar to the protective material 13 described in conjunction with FIG. 2, the protective material 13 shown in FIG. 3 also permits full sensor functionality of each MEMS element 12 while sealing those MEMS elements 12 from the external environment.

FIG. 4 shows a cross-sectional diagram of another chip 44 according to one or more embodiments. The chip 44 includes a substrate 10 having a main surface 11 and multiple MEMS elements 12 provided thereon. It will be appreciated that, while multiple MEMS elements 12 are shown, the chip 44 may be include a single MEMS element 12.

The chip 44 further includes at least one stop frame 17 provided on the substrate 10 at a region that surrounds the MEMS elements 12 such that the stop frame 17 is configured to confine the protective material 13 inside the region. That is, the stop frame 17 acts as a dam for the protective material 13.

The chip 44 may contain more than one MEMS areas, where each MEMS area includes one or more MEMS elements 12. Each MEMS area may be at least partially surrounded by a stop frame. Thus, multiple MEMS areas on the same chip surrounded a respective stop frame 17 may be provided.

The stop frame 17 may comprise any material that is suitable to be structured and/or locally deposited as a frame. For example, the stop frame 17 may comprise imide, SU-8 photoresist, silicone, or other like material. A material of the stop frame 17 may have a higher degree of elastic modulus than the protective material 13, but may also have a degree of elastic modulus that is equal to or lower than the elastic modulus of the protective material 13, so long as the material of the stop frame 17 is capable of being structured into a frame and able to confine the protective material 13 to a region.

The stop frame 17 may be formed in order to prevent the protective material 13 from flowing to another part of the chip 44 that is intended to remain free of the protective material 13. For example, the stop frame 17 may be used to prevent the protective material 13 from flowing onto bond pads (not shown) of the chip 44. In another example, the stop frame 17 may be provided at or in proximity to an inner edge of one or more trenches 16 in order to prevent the protective material 13 from entering the one or more trenches 16.

Thus, the stop frame 17 may be formed prior to the deposition of the protective material 13 to contain the protective material 13 to a specific region of the chip 44. Furthermore, the stop frame 17 may be removed subsequent to curing the protective material 13.

In addition, a backside cavity 19 may be formed at the backside of the substrate 10 as an additional stress-decoupling feature that is integrally formed with the one or more trenches 16.

FIG. 5 shows a cross-sectional diagram of still another chip 54 according to one or more embodiments. The chip 54 includes a substrate 10 having a main surface 11 and multiple MEMS elements 12 provided thereon. It will be appreciated that, while multiple MEMS elements 12 are shown, the chip 44 may be include a single MEMS element 12.

The chip 54 may further include a coating 18 that is deposited on the main surface 11 of the substrate 10 at a region that surrounds the MEMS elements 12. The region at which the coating 18 is provided may be located between an outer MEMS element 12 and one or more trenches 16 or between an outer MEMS element 12 and another region of the chip 54 (e.g., a bond pad). The region at which the coating 18 is provided may be provided at or in proximity to an inner edge of one or more trenches 16 in order to prevent the protective material 13 from entering the one or more trenches 16. The coating 18 may have a selective coating property or composition (e.g., a hydrophobic material) that repels the protective material 13. Thus, the coating 18 may be configured to confine the protective material 13 inside the region and/or prevent the protective material 13 from flowing into a trench 16 or other part of the chip 54.

In addition, a backside cavity 19 may be formed at the backside of the substrate 10 as an additional stress-decoupling feature that is integrally formed with the one or more trenches 16.

Figure 6A:
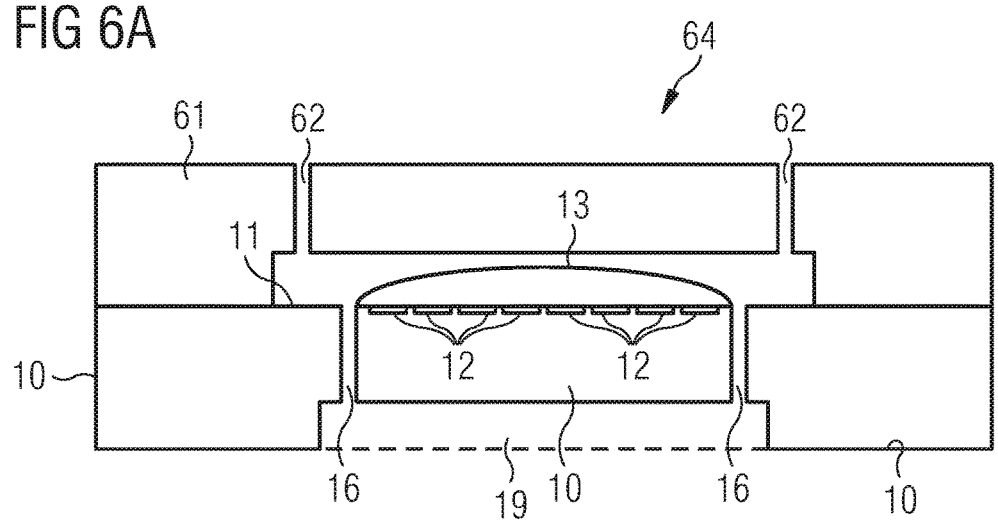
FIG. 6A shows a cross-sectional diagram of still another chip according to one or more embodiments.

FIG. 6A shows a cross-sectional diagram of still another chip 64 according to one or more embodiments. The chip 64 includes a substrate 10 having a main surface 11 and multiple MEMS elements 12 provided thereon. It will be appreciated that, while multiple MEMS elements 12 are shown, the chip 34 may be include a single MEMS element 12.

The chip 64 further includes a stress-decoupling feature made of one or more deep trenches 16 (i.e., one or more stress-decoupling trenches).

In this implementation, droplets of protective material 13 are dispensed and cured immediately right after finalization of the wafer and prior to a preassembly process (i.e., dicing process). In order to perform further processing (e.g., lamination in preassembly), it may be necessary to cover the protective material 13 with a lid 61 that covers the main surface 11 of the chip 64, as well as the protective material 13. The lid 61 may be a pre-structured silicon or glass wafer or a lid construction made of SU-8 photoresist or a foil.

In order to achieve a pressure coupling between a MEMS element and its surrounding (e.g., the chip), the lid 61 includes openings 62 formed via an etch process, grinding or laser. The openings 62 allow the lid 61 to be pressure coupled to the chip 64 via, for example, a vacuum seal. Alternatively, for products with a stress decoupling structure (e.g., trenches 16) with backside cavity 19, the openings 62 may be absent from the lid 61 and a pressure coupling between the lid 61 and the chip 64 can be achieved via the trenches 16. The lid 61 may remain closed until the end of the assembly process. An encapsulation of the MEMS element 12 with an integrated gel droplet of protective material 13 may simplify the mold process in the assembly process.

Figure 6B:
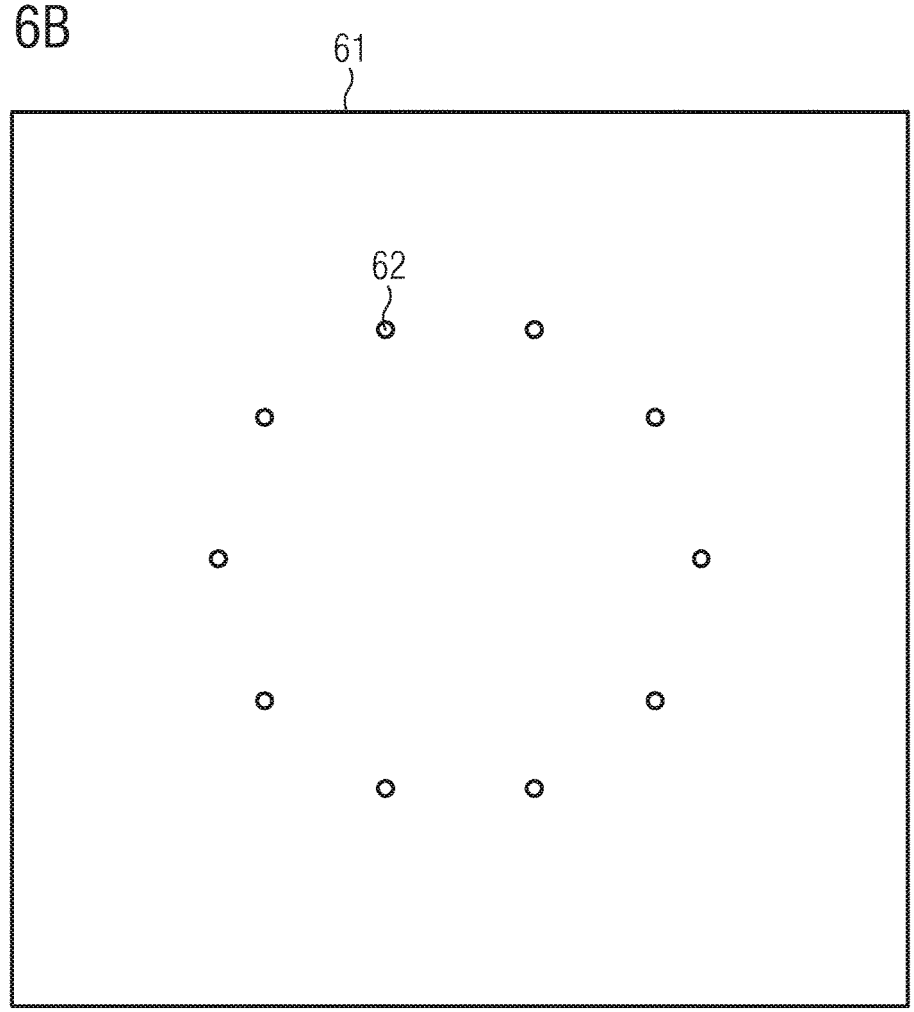
FIG. 6B shows a plan view of a lid structure shown in FIG. 6A according to one or more embodiments.

FIG. 6B shows a plan view of the lid 61 shown in FIG. 6A according to one or more embodiments. In particular, as described in FIG. 6A, the lid 61 may include openings 62 that are used pressure couple the lid 61 to the chip 64.

Figure 7:
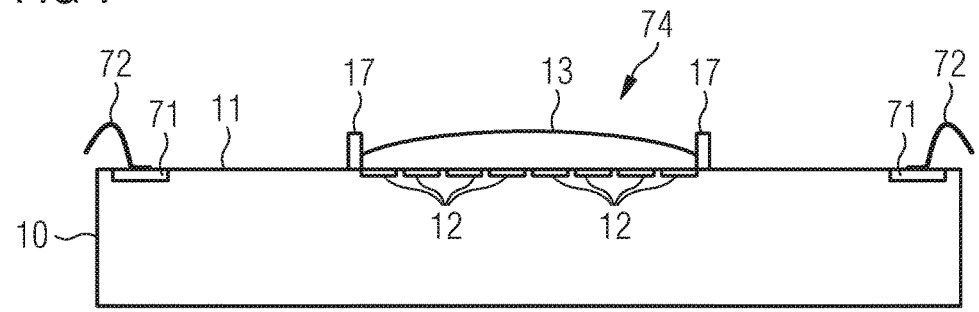
FIG. 7 shows a cross-sectional diagram of still another chip according to one or more embodiments.

FIG. 7 shows a cross-sectional diagram of still another chip 74 according to one or more embodiments. The features of chip 74 are similar to the features of chip 44 shown in FIG. 4, except chip 74 does not include stress-decoupling trenches 16 and shows bond pads 71 connected to bond wires 72.

Even in a case without trenches 16, a stop frame 17 can be advantageous, where the bond pads 71 are protected from gel bleeding. This is not only important for the application of the protective material 13 before the wire bonding but also when protective material 13 is deposited after wire bonding. For the subsequent back-end processes, adhesion issues during polymer encapsulation (e.g. by mold compound or coating) can be avoided caused by gel residues from the protective material 13 on the chip main surface 11. These issues might occur when the encapsulation lands on gel residues instead of the pure/clean chip.

Figure 8:
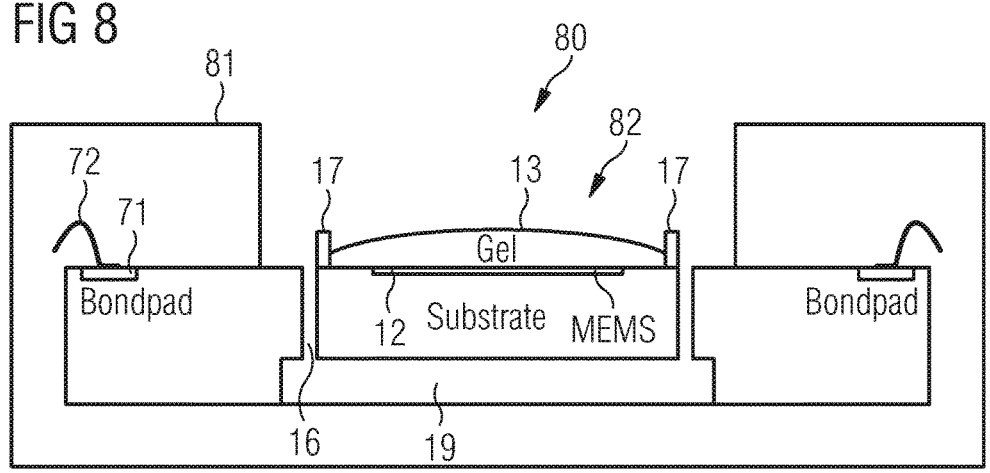
FIG. 8 shows a cross-sectional diagram of a package according to one or more embodiments.

FIG. 8 shows a cross-sectional diagram of a package 80 according to one or more embodiments. The package 80 includes a chip (e.g., any one of the chips described above) that is encapsulated by an encapsulation material 81 (e.g., a mold compound or coating). The chip includes a protective material 13 and a stop frame 17 as permanent features of the package (i.e., the end packaged device). The package 80 further includes an opening 82 such that the MEMS element 12 is able to measure a physical quantity, for example, a pressure of a pressure inducing entity.

Thus, during a package assembly process, a chip may be mounted to a package (e.g., partially encapsulated by encapsulation material 81), where the chip includes at least one MEMS element 12 and that further includes the protective material 13 disposed over the sensitive area of the at least one MEMS element 12. As described above, the protective material 13 is configured to permit a sensor functionality of the at least one MEMS element 12.

Figure 9:
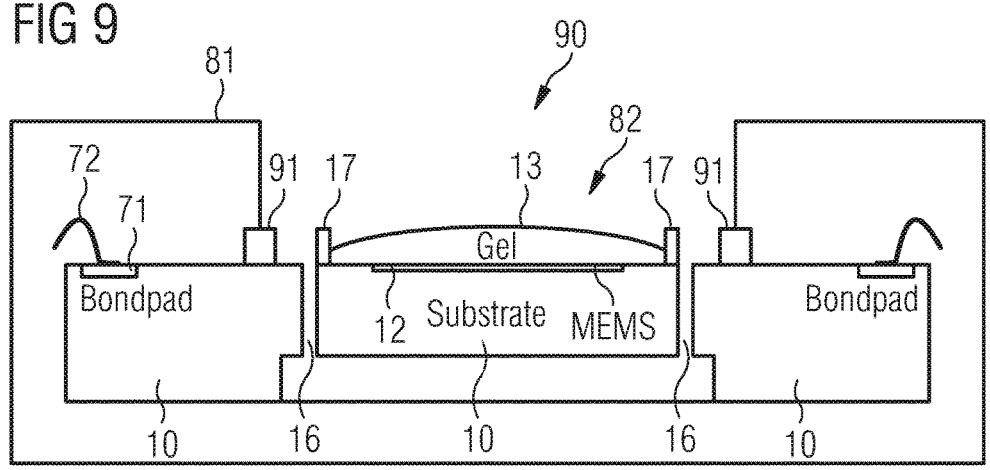
FIG. 9 shows a cross-sectional diagram of a package with a seal ring according to one or more embodiments.

FIG. 9 shows a cross-sectional diagram of a package 90 according to one or more embodiments. The package 90 is similar to package 80 shown in FIG. 8, with the addition of a seal ring 91. The seal ring 91 is a frame structure that encircles or at least partially encircles the stop frame 17 and the MEMS element 12. Additionally, the seal ring 91 is spaced apart from the stop frame 17 towards the periphery of the substrate 10, and may be formed on an opposite side of the deep trench(es) 16 (i.e., one or more stress-decoupling trenches) relative to the stop frame 17. For example, the seal ring 91 may be arranged on the substrate 10, between the stop frame 17 and a bond pad 71. In the case a deep trench 16 is present, the seal ring 91 may be arranged on the substrate 10, between the deep trench 16 and the bond pad 71.

The seal ring 91 may be formed with a same material as the material of the stop frame 17, and may be formed during a same processing step as the stop frame. Thus, the seal ring 91 and the stop frame may be formed simultaneously or substantially simultaneously during a processing step. Specifically, the seal ring 91 is formed prior to applying the encapsulation material 81 (e.g., a mold compound or coating) during assembly.

The seal ring 91 may facilitate use of a mold tool that is configured to apply the encapsulation material 81 to form the package. For example, a mold tool (not shown) may be placed on the sealing frame, and mold is attached on everything that is outside of the seal ring 91.

In view of the above, a protective material 13 is provided as a permanent protective material that is deposited in between a front end process and a preassembly process or between the preassembly process and the package assembly such that one or more MEMS elements 12 can be protected from particles and humidity. Furthermore, the protective material 13 is made of a material that grants full sensor functionality of the MEMS element, including mechanical functionality and electrical functionality, while sealing an entire surface of the MEMS element.

More particularly, the protective material permits full sensor functionality of the MEMS element, including mechanical functionality and electrical functionality, while sealing an entire surface of the MEMS element. Even more particularly, the protective material is configured such that no functionality of the MEMS element is impeded by the protective material.

By ensuring that the functionality of the MEMS element 12 remains intact, the protective material 13 may be deposited onto the MEMS element 12 as a permanent material at an early stage of the chip fabrication process. Thus, the MEMS element 12 may already be configured in an operable state (e.g., a final operable state) at the time the protective material 13 is deposited onto the MEMS element 12, and the protective material 13 may remain completely intact after deposition, including throughout the assembly process, such that it remains a feature in the final packaged product.

Although embodiments described herein relate to MEMS pressure sensors, it is to be understood that other implementations may include other types of pressure sensors or other types of MEMS devices or MEMS elements. In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the method steps may be executed by such an apparatus.

Depending on certain implementation requirements, embodiments provided herein can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein refers to any of the foregoing structures or any other structure suitable for implementation of the techniques described herein. In addition, in some aspects, the functionality described herein may be provided within dedicated hardware and/or software modules. Also, the techniques could be fully implemented in one or more circuits or logic elements.

The above described example embodiments that are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A method of protecting a microelectromechanical systems (MEMS) element, comprising:
    providing at least one MEMS element, comprising a sensitive area, on a substrate;
    depositing, prior to a package assembly process, a protective material over the sensitive area of the at least one MEMS element such that the sensitive area of at least one MEMS element is sealed from an external environment, wherein the protective material permits a sensor functionality of the at least one MEMS element;
    forming at least one stop frame on the substrate at a region that surrounds the at least one MEMS element, wherein the at least one stop frame is configured to confine the protective material inside the region
    curing the protective material; and
    removing the at least one stop frame subsequent to curing the protective material.

2. The method of claim 1, further comprising:
    separating a portion of the substrate that includes the at least one MEMS element to form a chip, wherein the chip includes at least one stress-decoupling trench laterally spaced from the at least one MEMS element and extending into the substrate, and the protective material is confined to an area within a region defined by the at least one stress-decoupling trench.

3. The method of claim 1, wherein the at least one stop frame comprises imide, SU-8, or silicone, each having a higher degree of elastic modulus than the protective material.

4. The method of claim 1, further comprising:
    separating a portion of the substrate that includes the at least one MEMS element to form a chip, wherein the chip includes at least one stress-decoupling trench at an edge of the region such that the at least one stop frame is formed proximate to the at least one stress-decoupling trench and is configured to prevent the protective material from entering the at least one stress-decoupling trench.

5. The method of claim 1, further comprising:
depositing a coating on the substrate at a region that surrounds the at least one MEMS element, wherein the coating is configured to confine the protective material inside the region.

6. The method of claim 1, further comprising:
performing the package assembly process, including mounting a chip to a package, wherein the chip includes a portion of the substrate that includes the at least one MEMS element and that further includes the protective material disposed over the sensitive area of the at least one MEMS element.

7. The method of claim 1, wherein depositing the protective material comprises:
depositing the protective material as a locally defined droplet confined to a local region of the substrate that surrounds the at least one MEMS element.

8. The method of claim 7, wherein the protective material is deposited using inkjet printing or micro dispensing.

9. The method of claim 1, wherein each of the at least one MEMS element is a pressure sensor.

10. The method of claim 1, wherein the protective material is a temperature hardening gel or a ultraviolet (UV) hardening gel.

11. The method of claim 1, wherein protective material permits full sensor functionality of the MEMS element, including mechanical functionality and electrical functionality, while sealing an entire surface of the at least one MEMS element.

12. The method of claim 1, wherein the protective material is a permanent protective material deposited in between a front end process and a preassembly process or between the preassembly process and the package assembly process.

13. A semiconductor device comprising:
a semiconductor chip comprising:
a substrate;
at least one microelectromechanical systems (MEMS) element, comprising a sensitive area, disposed at a surface of the substrate; and
a protective material disposed over the sensitive area of the at least one MEMS element such that the sensitive area of at least one MEMS element is sealed from an external environment, wherein the protective material is configured to permit a sensor functionality of the at least one MEMS element;
a package to which the semiconductor chip is mounted, wherein the package includes encapsulation material that is excluded from a first region, the first region extending over the sensitive area of the at least one MEMS element;
at least one stress-decoupling trench laterally spaced from the at least one MEMS element and extending into the substrate, and the protective material is confined to an area within a region defined by the at least one stress-decoupling trench,
wherein the at least one stress-decoupling trench defines an inside region of the surface of the substrate and a peripheral region of the surface of the substrate, and
the encapsulation material is attached to the surface of the substrate at the peripheral region, and the first region is defined at least by the inside region.

14. The semiconductor device of claim 13, wherein the semiconductor chip further comprises:
at least one stop frame disposed on the surface of the substrate at a second region, the second region surrounding the at least one MEMS element, wherein the at least one stop frame is configured to confine the protective material inside the second region.

15. The semiconductor device of claim 14, wherein the at least one stop frame comprises imide, SU-8, or silicone, each having a higher degree of elastic modulus than the protective material.

16. The semiconductor device of claim 14, wherein
the at least one stress-decoupling trench is at an edge of the second region such that the at least one stop frame is formed proximate to the at least one stress-decoupling trench and is configured to prevent the protective material from entering the at least one stress-decoupling trench.

17. The semiconductor device of claim 13, wherein:
each of the at least one MEMS element is a pressure sensor,
the protective material is a locally defined droplet confined to a local region of the substrate that surrounds the at least one MEMS element, and
the protective material permits full sensor functionality of the MEMS element, including mechanical functionality and electrical functionality, while sealing an entire surface of the at least one MEMS element.

18. A semiconductor device comprising:
a semiconductor chip comprising:
a substrate;
at least one microelectromechanical systems (MEMS) element, comprising a sensitive area, disposed at a surface of the substrate; and
a protective material disposed over the sensitive area of the at least one MEMS element such that the sensitive area of at least one MEMS element is sealed from an external environment, wherein the protective material is configured to permit a sensor functionality of the at least one MEMS element;
a package to which the semiconductor chip is mounted, wherein the package includes encapsulation material that is excluded from a first region, the first region extending over the sensitive area of the at least one MEMS element;
at least one stop frame disposed on the surface of the substrate at a second region, the second region surrounding the at least one MEMS element, wherein the at least one stop frame is configured to confine the protective material inside the second region; and
a seal ring disposed on the surface of the substrate at a third region, the third region spaced apart from and surrounding the at least one stop frame, wherein the encapsulation material is attached to the surface of the substrate peripheral to the third region and is excluded from the surface of the substrate internal to the third region.

19. The semiconductor device of claim 18, wherein the encapsulation material is disposed onto the seal ring.

* * * * *